United States Patent
Zhang et al.

(10) Patent No.: US 9,997,583 B2
(45) Date of Patent: Jun. 12, 2018

(54) DOUBLE-FACED DISPLAY PANEL AND DOUBLE-FACED DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Chunbing Zhang, Beijing (CN); Bin Zhang, Beijing (CN); Shuai Hou, Beijing (CN); Yichiang Lai, Beijing (CN); Liang Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 14/768,983

(22) PCT Filed: Dec. 3, 2014

(86) PCT No.: PCT/CN2014/092957
§ 371 (c)(1),
(2) Date: Aug. 19, 2015

(87) PCT Pub. No.: WO2016/004726
PCT Pub. Date: Jan. 14, 2016

(65) Prior Publication Data
US 2016/0254336 A1    Sep. 1, 2016

(30) Foreign Application Priority Data
Jul. 11, 2014    (CN) .......................... 2014 1 0332533

(51) Int. Cl.
*H01L 27/32*    (2006.01)
*H01L 51/52*    (2006.01)
(Continued)

(52) U.S. Cl.
CPC .......... *H01L 27/3267* (2013.01); *G02F 1/137* (2013.01); *G02F 1/1396* (2013.01);
(Continued)

(58) Field of Classification Search
None
See application file for complete search history.

(56) References Cited

U.S. PATENT DOCUMENTS

2003/0227254 A1    12/2003  Terumoto
2005/0264471 A1*   12/2005  Yamazaki ............. G06F 3/1446
                                                             345/1.1
(Continued)

FOREIGN PATENT DOCUMENTS

CN    2862090 Y      1/2007
CN    202736926 U    2/2013
(Continued)

OTHER PUBLICATIONS

First Chinese Office Action dated May 19, 2016; Appln. No. 201410332533.X.
(Continued)

*Primary Examiner* — Edward Glick
*Assistant Examiner* — Anthony G Quash
(74) *Attorney, Agent, or Firm* — Ladas & Parry LLP; Loren K. Thompson

(57) ABSTRACT

A double-faced display panel and a double-faced display device comprising the double-faced display panel are provided. The double-faced display panel comprises: a first display sub-unit, provided with a first display surface and a first non-display surface opposite to each other; a second display sub-unit, provided with a second display surface and a second non-display surface opposite to each other, and arranged back to back with the first display sub-unit, the second non-display surface facing the first non-display surface; and a reflection unit, arranged between the first display
(Continued)

sub-unit and the second display sub-unit. The reflection unit is configured to reflect display light emitted from the first display sub-unit back to the first display sub-unit and reflect display light emitted from the second display sub-unit back to the second display sub-unit.

19 Claims, 3 Drawing Sheets

(51) Int. Cl.
| | | |
|---|---|---|
| *G02F 1/1343* | (2006.01) | |
| *G02F 1/137* | (2006.01) | |
| *G02F 1/139* | (2006.01) | |
| *H01L 25/04* | (2014.01) | |
| *G02F 1/1333* | (2006.01) | |

(52) U.S. Cl.
CPC .... *G02F 1/13439* (2013.01); *G02F 1/134309* (2013.01); *H01L 25/048* (2013.01); *H01L 27/3211* (2013.01); *H01L 27/3232* (2013.01); *H01L 51/5271* (2013.01); *G02F 2001/133342* (2013.01); *G02F 2201/44* (2013.01); *G02F 2203/01* (2013.01); *G02F 2203/02* (2013.01); *H01L 2251/5315* (2013.01); *H01L 2251/5323* (2013.01)

(56) References Cited

U.S. PATENT DOCUMENTS

| | | |
|---|---|---|
| 2006/0050199 A1 | 3/2006 | Hsu et al. |
| 2006/0092355 A1* | 5/2006 | Yang ................. G02F 1/133555 349/114 |
| 2007/0114916 A1 | 5/2007 | Chang et al. |
| 2009/0040422 A1* | 2/2009 | Misono ................ G02B 6/005 349/62 |
| 2011/0286073 A1* | 11/2011 | Lo ........................ G02B 26/005 359/290 |
| 2015/0022768 A1* | 1/2015 | Li ..................... G02F 1/134309 349/108 |

FOREIGN PATENT DOCUMENTS

| | | | | |
|---|---|---|---|---|
| CN | 102998845 A | * | 3/2013 | ......... G02F 1/13357 |
| CN | 102998845 A | | 3/2013 | |
| CN | 103246105 A | * | 8/2013 | ........... G02F 1/1333 |
| CN | 103257474 A | | 8/2013 | |
| CN | 103293793 A | * | 9/2013 | ....... G02F 1/133555 |
| CN | 203299494 U | | 11/2013 | |
| CN | 104155791 A | | 11/2014 | |
| JP | 2003-185994 A | | 7/2003 | |
| JP | 2004-045727 A | | 2/2004 | |
| JP | 2004-199028 A | | 7/2004 | |

OTHER PUBLICATIONS

International Search Report with English translation and Written Opinion both dated Apr. 16, 2015; PCT/CN2014/092957.
Extended European Search Report dated Mar. 16, 2018; Appln. No. 14882144.0.

\* cited by examiner

DOUBLE-FACED DISPLAY PANEL AND DOUBLE-FACED DISPLAY DEVICE

TECHNICAL FIELD

Embodiments of the invention relate to a double-faced display panel and a double-faced display device comprising the double-faced display panel.

BACKGROUND

With diversified demands on a display function, a double-faced display device is widely adopted. Double-faced display has many advantages, for example, when the double-faced display device is adopted as a television signal receiving device at home, it can be embedded into a door frame or partition wall of adjacent rooms, so persons in different rooms can acquire one piece or different pieces of information at the same time.

However, due to diversity of application environments, the double-faced display device has problems of low light utilization, small contrast between display brightness and ambient light, difficulty in recognizing a display picture under bright light and the like.

SUMMARY OF THE INVENTION

Embodiments of the invention provide a double-faced display panel and a double-faced display device comprising the double-faced display panel, which has higher light utilization, improves contrast between display brightness and ambient light and has a better display effect.

In one aspect, an embodiment of the invention provides a double-faced display panel, comprising: a first display sub-unit, provided with a first display surface and a first non-display surface opposite to each other; a second display sub-unit, provided with a second display surface and a second non-display surface opposite to each other, and arranged back to back with the first display sub-unit, the second non-display surface facing the first non-display surface; and a reflection unit, arranged between the first display sub-unit and the second display sub-unit, wherein the reflection unit is configured to reflect displaying light emitted from the first display sub-unit back to the first display sub-unit and reflect displaying light emitted from the second display sub-unit back to the second display sub-unit.

In another aspect, an embodiment of the invention further provides a double-faced display device, comprising: a display panel, which is the double-faced display panel described above; and a drive circuit, connected with the display panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

Figure 1:
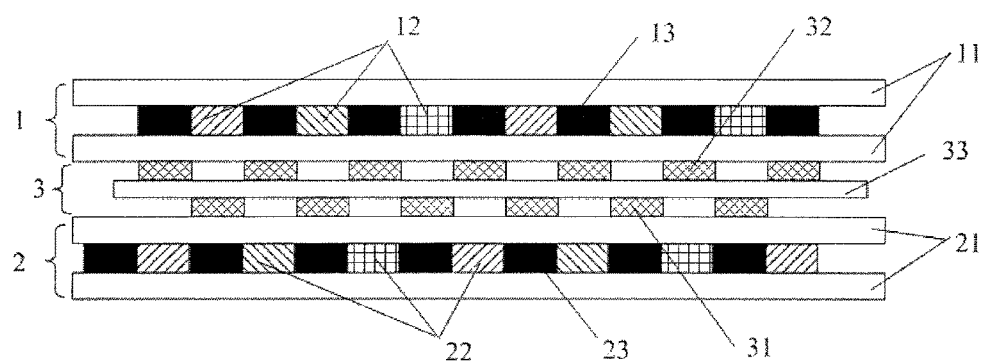
FIG. 1 is a sectional structural diagram of a double-faced display panel according to a first embodiment of the invention.

The first embodiment of the invention provides a double-faced display panel; as shown in FIG. 1, the double-faced display panel comprises: a first display sub-unit 1, provided with a first display surface and a first non-display surface opposite to each other; a second display sub-unit 2, provided with a second display surface and a second non-display surface opposite to each other, the second display sub-unit 2 being arranged back to back with the first display sub-unit 1, and the second non-display surface facing the first non-display surface; and a reflection unit 3, arranged between the first display sub-unit 1 and the second display sub-unit 2, and configured to reflect display light emitted from the first display sub-unit 1 back to the first display sub-unit 1 and reflect display light emitted from the second display sub-unit 2 back to the second display sub-unit 2.

Exemplarily, as shown in FIG. 1, the first display sub-unit 1 includes two first substrates 11 oppositely arranged and a plurality of first sub-pixels 12 arranged between the two first substrates 11; the second display sub-unit 2 includes two second substrates 21 oppositely arranged and a plurality of second sub-pixels 22 arranged between the two second substrates 21. In this way, light emitted from the first display sub-unit 1 is emitted by the first sub-pixels 12 of the first display sub-unit 1, light emitted from the second display sub-unit 2 is emitted by the second sub-pixels 22 of the first display sub-unit 1, and the reflection unit 3 is configured to reflect the light emitted from the first sub-pixels 12 back to the first display sub-unit 1 and reflect the light emitted from second sub-pixels 22 back to the second display sub-unit 2.

Figure 2:
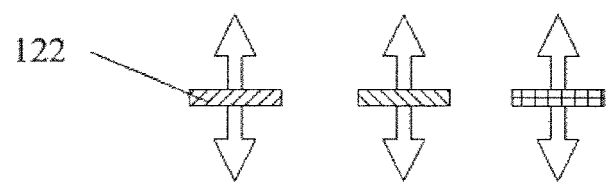
FIG. 2 is a light emitting schematic diagram of a sub pixel in FIG. 1.

Exemplarily, each of the first sub-pixels 12 and the second sub-pixels 22 includes an Organic Light-Emitting Diode (OLED), wherein the OLED may be of a top emitting type or a double directional emitting type. For example, when the OLED included by each of the first sub-pixels 12 and the second sub-pixels 22 is of the top emitting type, namely, each OLED of the first sub-pixels 12 and each OLED of the second sub-pixels 22 respectively emit light to the display surfaces disposed back to back of the first display sub-unit and the second display sub-unit, as the reflection unit 3 is arranged between the non-display surfaces facing each other of the first display sub-unit and the second display sub-unit, the reflection unit 3 can reflect the light deflected and emitted to the non-display surfaces back to the first display sub-unit and the second display sub-unit, thus improving the light utilization. For example, as shown in a light emitting schematic diagram of each sub-pixel in FIG. 2, when the OLED included by each of the first sub-pixels 12 and the second sub-pixels 22 is the double directional emitting type, one OLED can not only emit light to the top, but also emit light to the bottom (i.e., a side facing the reflection unit 3), the light emitted to the top can directly be transmitted through the first display sub-unit 1 or the second display sub-unit 2 for use, and the light emitted to the bottom is reflected by the reflection unit 3 and then be transmitted through the first display sub-unit 1 or the second display sub-unit 2 for use, thus improving the light utilization of the double-faced display panel.

Figure 3:
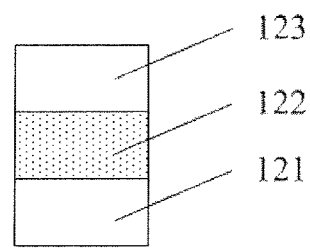
FIG. 3 is a structural schematic diagram of the sub pixel in FIG. 1.

Exemplarily, a structure of each OLED included by each of the first sub-pixels 12 and the second sub-pixels 22 may include three layers: an anode, a light emitting layer and a cathode, for example, FIG. 3 shows the structure of the OLED included by the first sub-pixel 12, comprising: an anode 121, a cathode 123 and a light emitting layer 122 arranged between the anode 121 and the cathode 123. Of course, in order to further improve performance of the OLED, the OLED may further include an organic functional layer arranged between the anode 121 and the cathode 123, and the organic functional layer includes at least one of a hole injection layer, a hole transport layer, an electron blocking layer, a hole and exciton blocking layer, an electron transport layer and an electron injection layer. The organic functional layer may be flexibly selected according to needs in actual application, which will not be repeated herein.

In addition, it should be noted that for the OLED of top emitting type, an electrode arranged close to the display surface of the first or second display sub-unit may be an anode or a cathode, but is a transparent electrode, correspondingly, the other electrode except the electrode close to the display surface may be a non-transparent electrode or a reflection electrode; for the OLED of double directional emitting type, at least one of the cathode or the anode is transparent.

Exemplarily, the first sub-pixels 21 may include first sub-pixels with three colors of red (R), green (G) and blue (B), and the second sub-pixels 22 may also include second sub pixels with three colors of red (R), green (G) and blue (B), that is to say, color display is realized in a full color manner. Or, each of the first sub-pixels and the second sub-pixels may include a white OLED, and RGB color filters are arranged on the substrates at a light exiting side, so the full color display is realized in a WOLED-COA manner; of course, the color display may be realized in a WOLED-CF (a white OLED and four color filters of R, G, B, W) manner, which is not limited by the embodiment of the invention.

Exemplarily, the reflection unit 3 includes a switch layer 33 and a first reflection layer 31 and a second reflection layer 32 which are respectively complementarily arranged on both sides of the switch layer 33 in a staggered manner. The first reflection layer 31 and the second reflection layer 32 may be a reflection mirror, for example, a chemically silvered silver mirror. The first reflection layer 31 is disposed to correspond to the first sub-pixels 12 and is separated from the first display sub-unit 1 by the second reflection layer 32 and the switch layer 33, the second reflection layer 32 is disposed to correspond to the second sub-pixels 22 and is separated from the second display sub-unit 2 by the first reflection layer 31 and the switch layer 33, the first reflection layer 31 is arranged on a side of the switch layer 33 close to the second display sub-unit 2, and the second reflection layer 32 is arranged on a side of the switch layer 33 close to the first display sub-unit 1. In the embodiment, the first reflection layer 31 and the second reflection layer 32 are arranged on both sides of the switch layer 33, "staggered" means that orthogonal projections of the first reflection layer 31 and the second reflection layer 32 do not overlap on the switch layer 33, and "complementarily" means that the first reflection layer 31 and the second reflection layer 32 can form a whole seamless pattern by parallel movement to the same plane.

Figure 4:
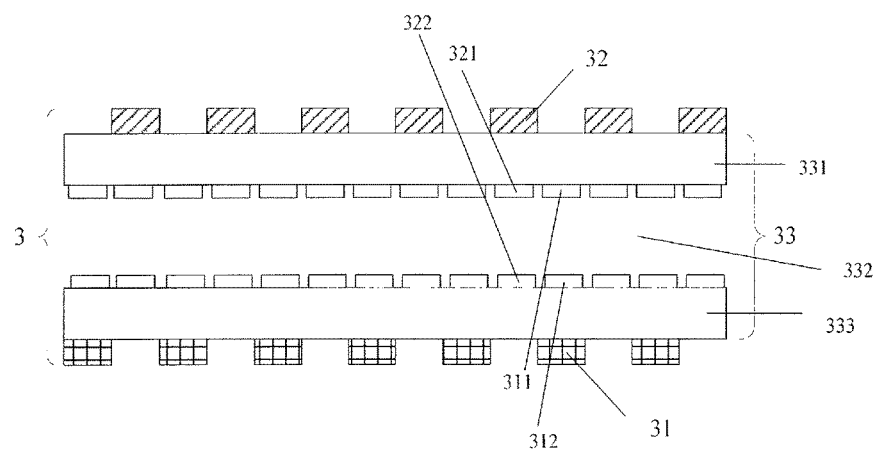
FIG. 4 is a schematic sectional diagram of a reflection unit according to the first embodiment of the invention.

The switch layer 33 is mainly used for adjusting light to activate or deactivate reflection. Exemplarily, as shown in FIG. 4, the switch layer 33 includes a liquid crystal cell, the liquid crystal cell including an upper substrate 331, a lower substrate 333 and a liquid crystal layer 332 arranged between the upper substrate 331 and the lower substrate 333, wherein the liquid crystal cell further includes a control electrode, the control electrode including: a plurality of first upper electrodes 311 and second upper electrodes 321 which are alternately arranged at an interval on a side of the upper substrate 331 close to the liquid crystal layer 332, and a plurality of first lower electrodes 312 and second lower electrodes 322 which are alternately arranged at an interval on a side of the lower substrate 333 close to the liquid crystal layer 332, wherein the first upper electrodes 311 and the first lower electrodes 312 are arranged in pair and correspond to the first reflection layer 31, the second upper electrodes 321 and the second lower electrodes 322 are arranged in pair and correspond to the second reflection layer 32, the first upper electrodes 311 and the first lower electrodes 312 cooperate with each other to control corresponding liquid crystal in the liquid crystal cell to deflect, and the second upper electrodes 321 and the second lower electrodes 322 cooperate with each other to control corresponding liquid crystal in the liquid crystal cell to deflect.

Exemplarily, when the first upper electrodes 311 and the first lower electrodes 312 are respectively applied with voltages with a voltage difference, the liquid crystal positioned between the first upper electrodes 311 and the first lower electrodes 312 in the liquid crystal cell deflects, and when the second upper electrodes 321 and the second lower electrodes 322 are respectively applied with voltages with a voltage difference, the liquid crystal positioned between the second upper electrodes 321 and the second lower electrodes 322 in the liquid crystal cell deflects. Herein, the plurality of first upper electrodes 311 may be applied with a same voltage, the plurality of first lower electrodes 312 may be applied with a same voltage, the plurality of second upper electrodes 321 may be applied with a same voltage, the plurality of second lower electrodes 322 may be applied with a same voltage, the first upper electrodes and the second upper electrodes are respectively controlled, and the first lower electrodes and the second lower electrodes are respectively controlled. For example, the first upper electrodes 311 and the first lower electrodes 312 are respectively applied with a positive voltage and a reference voltage, and the second upper electrodes 321 and the second lower electrodes 322 are respectively applied with a positive voltage and a reference voltage, and in this way, an electric field is formed by applying a voltage to the control electrode, so that deflection of the liquid crystal can be conveniently controlled.

Exemplarily, the control electrode may be made from transparent electrode material, for example, Indium Tin Oxide (ITO), and the liquid crystal in the liquid crystal cell sandwiched between two layers of sub-electrodes may be Twisted Nematic (TN) type liquid crystal; namely, the liquid crystal deflects to form a transparent state when an electric field is applied, and is in an non-transparent state when no electric field is applied. A light control state of the reflection unit 3 is changed by controlling a magnitude of the electric field between the sub-electrodes.

Figure 5:
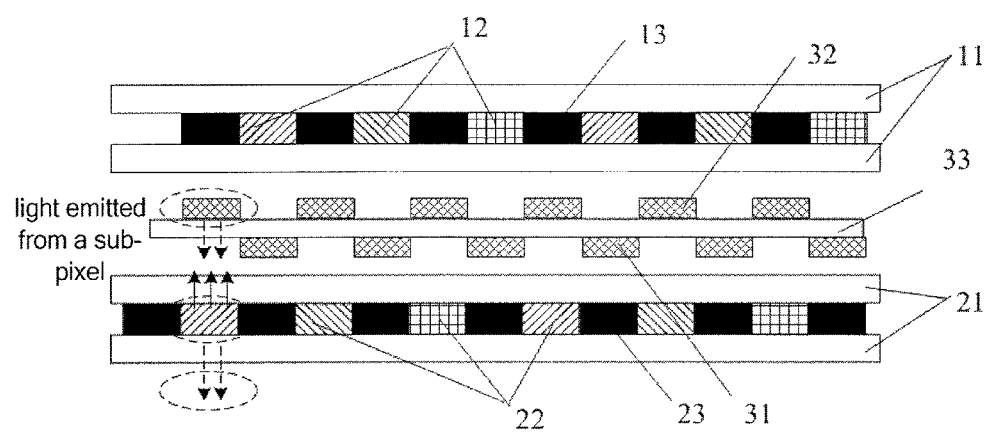
FIG. 5 is a light path schematic diagram of the double-faced display panel under a light emitting state of the sub pixel in FIG. 1.
Figure 6:
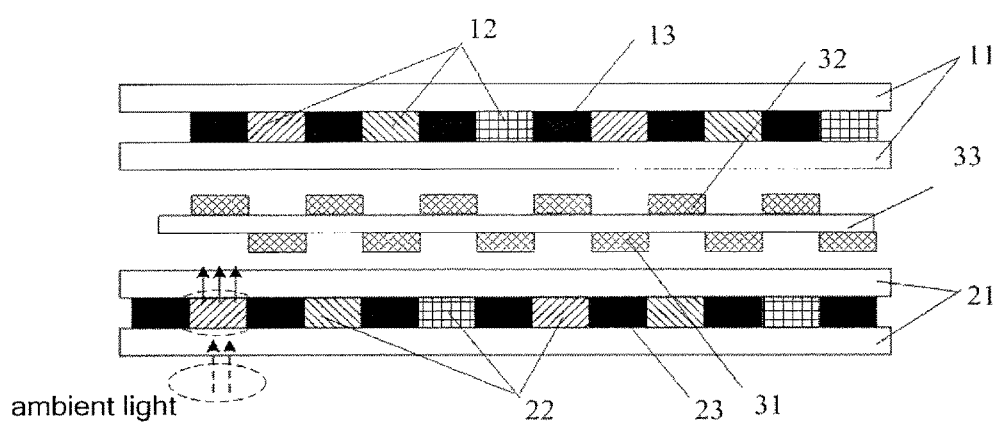
FIG. 6 is a light path schematic diagram of the double-faced display panel under a non-light emitting state of the sub pixel in FIG. 1.

In the embodiment, the switch layer 33 may be switched between two different optical states of the transparent state and the non-transparent state, so the reflection layer performs a function or not. Exemplarily, as shown in FIG. 5, when a certain sub-pixel is in a light (light emitting) state, the control electrode in a corresponding region is controlled to apply an electric field, liquid crystal molecules are regularly arranged perpendicular to the electric field, and refractive indexes of the liquid crystal molecules are matched to form the transparent state, so the reflection layer corresponding to the sub-pixel play a role, and light emitted by the transparent sub-pixel can be reflected, so as to achieve a highlight display effect and an energy-saving aim; as shown in FIG. 6, when a certain sub-pixel is in a dark (non-light emitting) state, no electric field is formed by controlling the control electrode in the corresponding region, the liquid crystal molecules are irregularly arranged; as the refractive indexes of the liquid crystal molecules are anisotropic, a non-transparent state is formed, incident ambient light is blocked by the switch layer 33, the reflection layer corresponding to the sub-pixel does not play a role, and the ambient light cannot be reflected by the reflection layer, and the ambient light is absorbed when irradiating the double-faced display panel regardless of brightness of the ambient light, so as to achieve the aim of improving the contrast between the ambient light and the display brightness of the display panel.

In the double-faced display panel of the embodiment, the first display sub-unit 1 further includes first black matrixes (BM) 13 arranged between adjacent first sub-pixels 12, the second display sub-unit 2 further includes second black matrixes 23 arranged between adjacent second sub-pixels 22, the first reflection layer 31 is disposed to correspond to the second black matrixes 23, and the second reflection layer 32 is disposed to correspond to the first black matrixes 13.

Exemplarily, the first reflection layer 31, the first sub-pixel 12 and the second black matrix 23 are same in area; and the second reflection layer 32, the second sub-pixel 22 and the first black matrix 13 are same in area. Namely, the sub-pixels in the first display sub-unit 1 and the second display sub-unit 2 are arranged in a staggering manner respectively, the first sub-pixels 12 of the first display sub-unit 1 correspond to the first reflection layer 31 and the second black matrixes 23 of the second display sub-unit 2, which not only effectively use light emitted by the first sub-pixels 12 in the first display sub-unit 1 to improve light utilization of the first display sub-unit 1, but also does not influence operation of the second display sub-unit 2; similarly, the second sub-pixels 22 of the second display sub-unit 2 correspond to the second reflection layer 32 and the first black matrixes 13 of the first display sub-unit 1, which not only effectively use light emitted by the second sub-pixels 22 in the second display sub-unit 2 to improve light utilization of the second display sub-unit 2, but also does not influence operation of the first display sub-unit 1.

Of course, the areas of the first reflection layer 31, the first sub-pixel 12 and the second black matrix 23 may also be different, and the areas of the second reflection layer 32, the second sub-pixel 22 and the first black matrix 13 may also be different, as long as the operation of the second display sub-unit 2 and that of the first display sub-unit 1 do not affect each other and the light utilization can be improved, which is not limited by the embodiment of the invention.

Exemplarily, the first sub-pixel 12 and the second sub-pixel 22 are same in area. In this way, the areas of the first sub-pixel 12, the first black matrix 13 and the first reflection layer 31 in the first display sub-unit 1 are same as those of the second sub-pixel 22, the second black matrix 23 and the second reflection layer 32 in the second display sub-unit 2, in order to further simplify a design process and improve process efficiency.

Further, an embodiment of the invention further provides a manufacturing method of a double-faced display panel; when the above double-faced display panel is manufactured, the first display sub-unit 1, the second display sub-unit 2 and the reflection unit 3 may be manufactured respectively, then they are bonded with a sealant to form a whole; also one display sub-unit may be taken as a reference, and the reflection unit 3 and the other display sub-unit may be formed on one side of the display sub-unit in sequence.

Hereinafter, by taking an example of forming the double-faced display panel in the second manner, the process is simply described as follows:

Step 1: manufacturing a sub-pixel including an OLED and a black matrix on a first base substrate, for example, a transparent substrate, and arranging a second base substrate opposite to the first base substrate, to form one display sub-unit.

Exemplarily, each sub-pixel may emit red (R), green (G) or blue (B) color light, and the black matrix and the sub pixel are same in area.

Step 2: manufacturing a reflection layer at a position, corresponding to the black matrix, of the second base substrate at a non-display surface of the display sub-unit; and then forming a switch layer and the other switch layer on the reflection layer, wherein the positions of the two reflection layers are staggered and complementary;

Step 3: arranging a third base substrate, for example a transparent substrate, on the other reflection layer, and then manufacturing a sub-pixel including an OLED and a black matrix on the third base substrate and arranging a fourth base substrate opposite to the third base substrate, to form the other display sub-unit.

In the double-faced display panel in the embodiment, as the reflection unit is arranged between the two display sub-units arranged back to back, the reflection unit can reflect displaying light emitted by each of the display sub-units and travelling to the non-display surface back to the corresponding display sub-unit for reuse, and can block ambient light, so that the double-faced display panel has higher display brightness and high contrast, the contrast between the display brightness of the display panel and the ambient light can be improved, a better display effect is achieved, and in addition, more energy is saved under the condition of the same display brightness.

A Second Embodiment

The second embodiment of the invention provides a double-faced display device, comprising a display panel and a drive circuit connected with the display panel, and the display panel is the double-faced display panel in the first embodiment. Wherein, the first display sub-unit and the second display sub-unit have independent drive circuits, and the first display sub-unit and the second display sub-unit display same or different images at a certain moment.

In the double-faced display device of the embodiment, one assembly manner is: firstly bonding two first substrates 11 with a first sub-pixel 12 by a sealant to form a first display sub-unit 1; meanwhile, connecting two second substrates 21 with a second sub-pixel 22 by a sealant to form a second display sub-unit 2; then arranging a reflection unit 3 between the first display sub-unit 1 and the second display sub-unit 2, aligning them, and performing frame sealing by using a sealant, so as to obtain the double-faced display device.

The double-faced display device has two independent input ports, through which same or different signals may be input; and correspondingly, same or different image information may be displayed.

When the two display sub-units of the double-faced display device display a same image, same signal sources are input to a drive port corresponding to the first display sub-unit 1 and a drive port corresponding to the second display sub-unit 2, and the same image information is sent to the first display sub-unit 1 and the second display sub-unit 2 for display at the same time; such a driving manner is usually used for a square panel, a highway billboards or other occasions where double-faced display is needed.

When the two display sub-units of the double-faced display device display different images, different signal sources are input to the drive port corresponding to the first display sub-unit 1 and the drive port corresponding to the second display sub-unit 2, and different image information are respectively sent to the first display sub-unit 1 and the second display sub-unit 2 for display; such a driving manner is usually used for a medical instrument, a teaching equipment, or double-faced panels and other occasions where double-faced display is needed.

In the double-faced display device, as the double-faced display panel thereof adopts the reflection unit to reflect the light emitted from the sub-pixels in the first display sub-unit and the second display sub-unit and travelling to the non-display surface for reuse, the light utilization of the double-faced display device is improved, and highlight and better contrast are realized, so the display device has better display effect, and a viewer can easily recognize a picture even under bright light and obtain a better visual experience.

It should be understood that the foregoing embodiments are only exemplary embodiments of the invention to describe the principle of the invention; however, the invention is not limited thereto. Those ordinarily skilled in the art can make various changes and modifications without departing from the spirit and essence of the invention, and such changes and modifications also fall into the protection scope of the invention.

The application claims priority of Chinese Patent Application No. 201410332533.X filed on Jul. 11, 2014, the disclosure of which is incorporated herein by reference in its entirety as part of the present application.

What is claimed is:

1. A double-faced display panel, comprising:
a first display sub-unit, provided with a first display surface and a first non-display surface opposite to each other;
a second display sub-unit, provided with a second display surface and a second non-display surface opposite to each other, and arranged back to back with the first display sub-unit, the second non-display surface facing the first non-display surface; and
a reflection unit, arranged between the first display sub-unit and the second display sub-unit,
wherein the reflection unit includes a switch layer, a first reflection layer and a second reflection layer, the first reflection layer and the second reflection layer are complementarily arranged on a first side and a second side of the switch layer in a staggered manner respectively, and orthogonal projections of the first reflection layer and the second reflection layer on the switch layer are non-overlapped and form a whole seamless pattern;
wherein the first display sub-unit comprises two first substrates oppositely arranged and a plurality of first sub-pixels arranged between the two first substrates, the second display sub-unit comprises two second substrates oppositely arranged and a plurality of second sub-pixels arranged between the two second substrates, and the first sub-pixels configured to emit first displaying light and the second sub-pixels configured to emit second displaying light are arranged in the staggered manner respectively;
wherein the first reflection layer is configured to reflect the first displaying light emitted from the first sub-pixels of the first display sub-unit back to the first display sub-unit and the second reflection layer is configured to reflect the second displaying light emitted from the second sub-pixels of the second display sub-unit back to the second display sub-unit.

2. The double-faced display panel according to claim 1, wherein the first reflection layer is arranged on the first side of the switch layer close to the second display sub-unit, and the second reflection layer is arranged on the second side of the switch layer close to the first display sub-unit.

3. The double-faced display panel according to claim 2, wherein the switch layer comprises: an upper substrate, a lower substrate, a liquid crystal layer arranged between the upper substrate and the lower substrate, and a control electrode arranged on sides of the upper substrate and the lower substrate close to the liquid crystal layer, the control electrode being applied with a voltage to control liquid crystal in a liquid crystal cell to deflect.

4. The double-faced display panel according to claim 3, wherein the control electrode comprises a plurality of first upper electrodes and a plurality of second upper electrodes which are alternately arranged at an interval on a side of the upper substrate close to the liquid crystal layer, and a plurality of first lower electrodes and a plurality of second lower electrodes which are alternately arranged at an interval on a side of the lower substrate close to the liquid crystal layer.

5. The double-faced display panel according to claim 4, wherein the first upper electrodes and the first lower electrodes are respectively applied with a positive voltage and a reference voltage, and the second upper electrodes and the second lower electrodes are respectively applied with a positive voltage and a reference voltage.

6. The double-faced display panel according to claim 1, wherein the first reflection layer is disposed to correspond to the first sub-pixels and the second reflection layer is disposed to correspond to the second sub-pixels.

7. The double-faced display panel according to claim 6, wherein a first black matrix is arranged between any two adjacent of the plurality of first sub-pixels, and a second black matrix is arranged between any two adjacent of the plurality of second sub-pixels.

8. The double-faced display panel according to claim 7, wherein the first reflection layer is disposed opposite to the second black matrix and the second reflection layer is disposed opposite to the first black matrix.

9. The double-faced display panel according to claim 8, wherein the first reflection layer, the first sub-pixel and the second black matrix are same in area; and the second reflection layer, the second sub-pixel and the first black matrix are same in area.

10. The double-faced display panel according to claim 9, wherein the first sub-pixel and the second sub-pixel are same in area.

11. The double-faced display panel according to claim 7, wherein each of the plurality of first sub-pixels and the plurality of second sub-pixels comprises an organic light-emitting member.

12. The double-faced display panel according to claim 6, wherein the switch layer comprises: an upper substrate, a lower substrate, a liquid crystal layer arranged between the upper substrate and the lower substrate, and a control electrode arranged on a side of the upper substrate and the lower substrate close to the liquid crystal layer, the control electrode being applied with a voltage to control liquid crystal in a liquid crystal cell to deflect.

13. The double-faced display panel according to claim 6, wherein each of the plurality of first sub-pixels and the plurality of second sub-pixels comprises an organic light-emitting member.

14. The double-faced display panel according to claim 1, wherein each of the plurality of first sub-pixels and the plurality of second sub-pixels comprises an organic light-emitting member.

15. The double-faced display panel according to claim 14, wherein the organic light-emitting member is of a double directional emitting type or a top emitting type.

16. The double-faced display panel according to claim 1, wherein the plurality of first sub-pixels comprise red, green and blue sub-pixels and the plurality of second sub-pixels comprise red, green and blue sub-pixels.

17. A double-faced display device, comprising:
a display panel, being the double-faced display panel according to claim 1; and
a drive circuit connected with the display panel.

18. The double-faced display device according to claim 17, wherein the first display sub-unit and the second display sub-unit respectively have independent drive circuits, and the first display sub-unit and the second display sub-unit display same or different images at a certain moment.

19. The double-faced display panel according to claim 1, wherein the switch layer comprises: an upper substrate, a lower substrate, a liquid crystal layer arranged between the upper substrate and the lower substrate, and a control electrode arranged on a side of the upper substrate and the lower substrate close to the liquid crystal layer, the control electrode being applied with a voltage to control liquid crystal in a liquid crystal cell to deflect.

* * * * *